Figure 1:
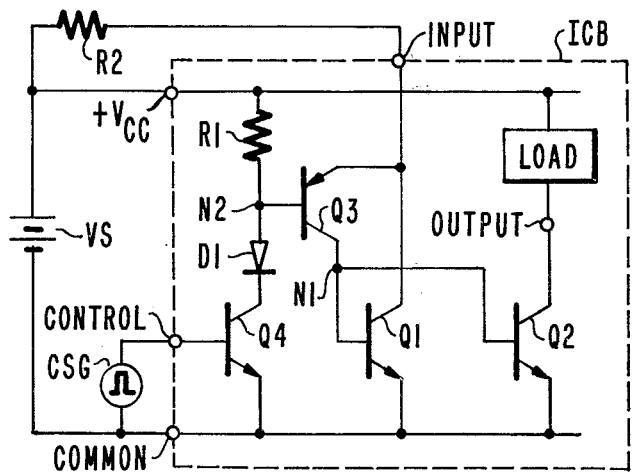

United States Patent [19]

Ahmed

[11] 4,160,944

[45] Jul. 10, 1979

[54] CURRENT AMPLIFIER CAPABLE OF SELECTIVELY PROVIDING CURRENT GAIN

[75] Inventor: Adel A. A. Ahmed, Annandale, N.J.

[73] Assignee: RCA Corporation, New York, N.Y.

[21] Appl. No.: 836,564

[22] Filed: Sep. 26, 1977

[51] Int. Cl.² .................................................. G05F 3/08
[52] U.S. Cl. ........................................ 323/4; 323/23; 330/296
[58] Field of Search ................. 323/1, 4, 23; 330/295, 330/296, 297

[56] References Cited

U.S. PATENT DOCUMENTS

| | | | |
|---|---|---|---|
| 3,813,607 | 5/1974 | Voorman | 323/4 X |
| 3,843,933 | 10/1974 | Ahmed | 330/26 |
| 3,973,215 | 8/1976 | Ahmed | 323/4 X |
| 3,982,171 | 9/1976 | Gersbach | 323/4 X |
| 4,045,694 | 8/1977 | Ahmed | 330/296 X |
| 4,063,032 | 12/1977 | Willcocks | 330/295 X |

Primary Examiner—A. D. Pellinen
Attorney, Agent, or Firm—H. Christoffersen; A. L. Limberg; E. P. Herrmann

[57] ABSTRACT

A current amplifier of the type having the principal conduction paths of first and second transistors connecting the input and output terminals respectively of the current amplifier to its common terminal, with a direct-coupled feedback connection between the input terminal and an interconnection of the control electrodes of the first and second transistors, is provided with capability for selectively providing or not providing current gain between its input and output terminals. To this end, a third transistor of complementary conductivity type has its principal conduction path included in the direct coupled feedback connection, being arranged to have its control electrode selectively clamped to the common terminal of the current amplifier to cause the current amplifier to exhibit current gain between its input and output terminals.

5 Claims, 3 Drawing Figures

CURRENT AMPLIFIER CAPABLE OF SELECTIVELY PROVIDING CURRENT GAIN

This invention relates to a current amplifier of a type selectively capable of providing or not providing current gain between its input and output terminals.

Such current amplifiers are useful, for example, where it is desired to provide, within the confines of a monolithic integrated circuit, a constant current generator which delivers current of such substantial value that its flow contributes substantially to the generation of heat within the chip. Constant current generators are conventionally provided in a monolithically integrated circuit by connecting the input terminal of a current amplifier located in the integrated circuit to a point of operating potential through a resistor. This resistor may be located external to the integrated circuit, keeping it from being a source of heat within the integrated circuit (and also permitting the value of the resistor to be selected). Still, the heat generated in the current amplifier itself may be higher than that desired. In circuits where the constant current generator need not generate current continuously, the heat generated in the current amplifier can be reduced by selectively inactivating the current amplifier.

The present inventor has discerned that it is useful, particularly where the currents handled by the current amplifier are large, to arrange for the additional elements used to inactivate the amplifier to be so placed that they do not have to carry the full current being switched. This can be done by arranging for the switching of the current amplifier between active and inactive modes so as to utilize the transistors used for current amplification for further duty, acting also as the elements for interrupting the flows of both the input current and the output current of the amplifier. This approach tends to conserve area on the integrated circuit die since no additional large-area power transistor need be used.

The present invention is embodied in a current amplifier of the following type having input, output, common and control terminals. First and second transistors have their principal conduction paths included in connections between the input and common terminals and between the output and common terminals, respectively, so arranged that the conductivity of their principal conduction paths is controlled respective to the potential at an interconnection between their control electrodes respective to that at the common terminal. A third transistor of complementary conductivity type has its principal conduction path arranged for selectively completing a direct-coupled feedback connection for said first transistor, which when completed conditions the principal conduction path of said first transistor to conduct input current applied to the input terminal. This feedback connection is completed between the input terminal and the interconnection between the control electrodes of the first and second transistors, whenever the third transistor is rendered conductive by application of suitable potential to its control electrode.

Figure 2:
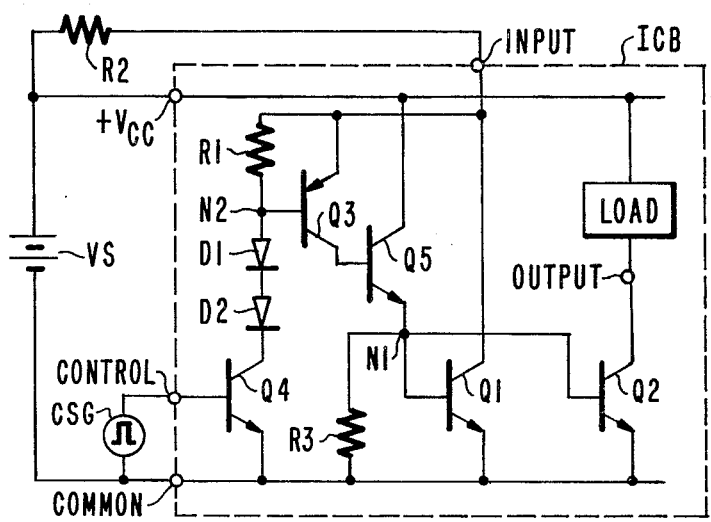
Figure 3:
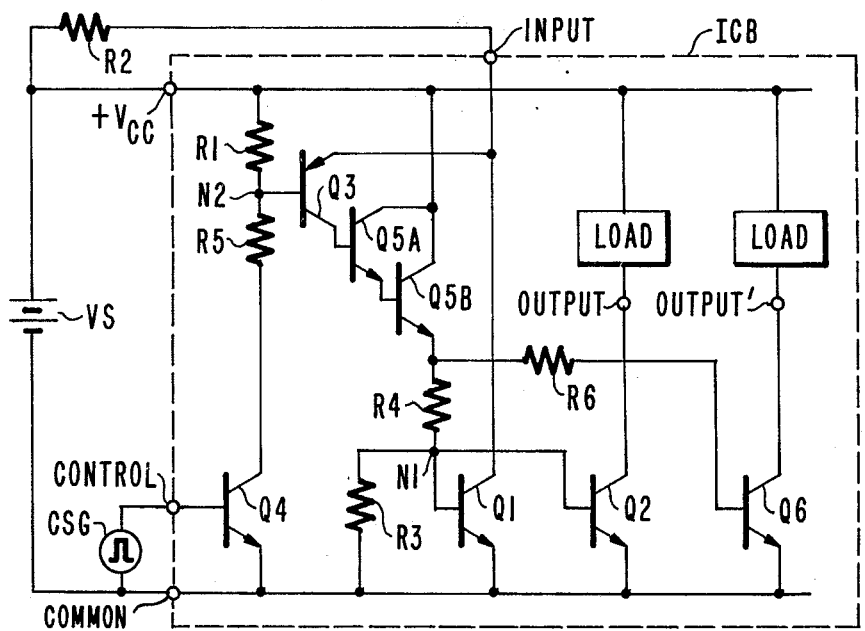

In the drawings:

Each of FIGS. 1, 2 and 3 is a schematic diagram of a current amplifier capable of selectively providing current gain or not, which current amplifier embodies the present invention.

In FIG. 1, transistors Q1, Q2, Q3 and Q4, diode D1 and resistor R1 are shown disposed upon an integrated circuit, shown schematically by their inclusion within a dotted-line boundary ICB. A direct voltage supply VS, shown as a battery, applies an operating potential, $+V_{CC}$, between terminals marked "COMMON" and "$+V_{CC}$" located at the interface between the integrated circuit and its surroundings. Terminals marked "INPUT" and "CONTROL" are also at this interface. A resistor R2 located external to the integrated circuit connects the $+V_{CC}$ and INPUT terminals to provide a path for input current flow. A control signal generator CSG, shown located external to the integrated circuit, at selected times applies a positive potential between the COMMON and CONTROL terminals, which, as will be subsequently described in detail, conditions the current amplifier to accept input current flowing from $+V_{CC}$ through R2 to the INPUT terminal. Responsive to this input current flow, a proportional current demand is presented at an OUTPUT terminal to a load, which OUTPUT terminal and load are shown as being located internal to the integrated circuit. Alternatively, the OUTPUT terminal may be located at the interface of the integrated circuit with its surroundings; and the load, outside the integrated circuit.

The collector-to-emitter paths of Q1 and Q2, their principal conduction paths, are connected from the INPUT and OUTPUT terminals, respectively, to the COMMON terminal. There is an interconnection N1 between the base, or control electrodes of Q1 and Q2; and, since the emitter electrodes of Q1 and Q2 each are connected to the COMMON terminal, Q1 and Q2 are thus arranged to receive the same value of emitter-to-base potential. In consequence of this, the conduction of Q2 is proportionally related to that of Q1. Q1 is selectively provided with direct-coupled collector-to-base feedback via the emitter-to-collector path of Q3, which being PNP is of complementary conductivity type to NPN transistors Q1 and Q2.

Absent conduction via the emitter-to-collector path of Q3, its principal conduction path, there is nothing to lift the potential at N1 positive with respect to the potential on the bus connected to the COMMON terminal. The base-emitter junctions of Q1 and Q2 then lack the threshold value of forward bias required to render their collector-to-emitter paths conductive. By reason of the collector-to-emitter path of Q1 being non-conductive, there is no circuit loop completed that includes VS, R2, and the collector-to-emitter path of Q1 as would cause input current to flow to the input terminal. By reason of the collector-to-emitter path of Q2 being non-conductive, no circuit is completed that includes VS, the load, and the collector-to-emitter path of Q2 as would permit flow of output current through the OUTPUT terminal.

Q3 will be non-conductive in FIG. 1 when Q4 is non-conductive owing to control signal generator CSG not applying a potential between the COMMON and CONTROL terminals that is of sufficient amplitude to bias Q4 into conduction. Q4 then demands no collector current to forward bias diode D1 and to develop a potential drop across R1 that permits clamping of the base electrode of Q3 close to the potential at the COMMON terminal. With no potential drop of consequence across R1, the base electrode of Q3 tends to rise in potential to $+V_{CC}$. Consequently, the base-emitter junction of Q3 is not forward-biased, so Q3 is non-conductive between its emitter and collector electrodes.

The current amplifier receives input current and exhibits current gain when control signal generator CSG applies a positive potential between the COMMON and CONTROL terminals of a value sufficiently in excess of the threshold value required to cause Q4 to be substantially conductive, drawing D1 into forward conduction and causing a current to flow through R1 and D1. The resultant potential drop across R1 permits Q4 to clamp its collector electrode to within a few tenths of a volt of the potential at its emitter electrode. Node N2 at the base electrode of Q3 will be clamped to a potential more positive than the COMMON terminal by the sum of the offset potential across forward-biased diode D1 (D1 being inserted to assure the collector-base junction of Q3 is reverse-biased to condition Q3 for normal transistor operation when its emitter-base junction is forward-biased) and the saturation voltage of Q4. Thus, a portion of the collector current of Q4 will flow as base current to Q3 and the emitter-to-collect path of Q3 is consequently conditioned for conduction, completing a direct-coupled collector-to-base feedback connection for Q1.

If, owing to insufficient input current flow through R2, the voltage at the INPUT terminal tends to rise above a threshold value, $V_T$, equal to the sum of the saturated emitter-to-collector voltage of Q4 and the offset potentials across forward-biased diode D1 and the emitter-base junction of Q3, the emitter-base junction of Q3 tends to be increasingly forward-biased, tending to increase the flow of collector current from Q3. This tendency towards increased current flow through the emitter-base junctions of Q1 and Q2 tends to increase the emitter-to-base potentials of Q1 and Q2. Responsive to tendency towards increase in its emitter-to-base potential, Q1 tends to increase its collector current. This tendency is checked only when the collector current of Q1 is sufficiently large that its flow through R2 increases the voltage drop thereacross to reduce the voltage at the INPUT terminal to its prescribed threshold value vis-a-vis potential at the COMMON terminal.

Any tendency for the voltage at the INPUT terminal to decrease below the prescribed threshold value tends to reduce conduction of Q3, tending to reduce the collector current available from Q3 to forward-bias the emitter-base junctions of Q1 and Q2, consequently tending to reduce the collector current demand of Q1 to decrease the drop across R2 and raise the potential at the INPUT terminal.

The value of the input current flowing during activation of the current amplifier is simply calculated according to OHM's Law, having a value substantially equal to $(V_{CC}-V_T)/R2$. The collector current Q2 demands will be substantially equal in amplitude to the input current multiplied by the ratio of the collector current versus emitter-to-base characteristics of Q2 to that of Q1. If Q2 and Q1 are vertical-structure transistors formed simultaneously by the same set of diffusion and-/or implantation steps, for example, this ratio will be substantially equal to the ratio of the area of the emitter-base junction of Q2 to that of Q1. Q1 and Q2 may be provided with emitter degeneration resistors having respective conductances in this same ratio without affecting current amplifier current gain; this will help improve the reliability with which this gain can be predicted. If the drop across these resistors is more than one or two tenths volt, means must be provided for increasing the potential offset between the base electrode of Q3 and the collector electrode of Q4, to afford adequate collector potential to Q3.

The FIG. 2 current amplifier exhibits typical modifications that can be made to the FIG. 1 current amplifier. Resistor R3 provides more rapid pull-down for transistors Q1 and Q2 when they are switched out of conduction; emitter-follower transistor Q5 has been added as a buffer to increase the load impedance at the collector electrode of Q3. The current gain of Q5 may be more than equal to this task, reducing the effect of the current diverted to the emitter of Q3 upon the current gain of the entire current amplifier. A further diode D2 is connected in series with D1 to compensate for the otherwise increased collector potential for Q3, owing to the offset potential across the emitter-base junction of Q5. R1 connects node N2 to the INPUT terminal rather than the $+V_{CC}$ terminal, permitting this resistor to take up less area on the integrated circuit and moving a substantial portion of the dissipation associated with the collector current flow of Q4 out of the integrated circuit, R2 taking up the burden.

FIG. 3 shows a current amplifier with different modifications of the FIG. 1 current amplifier. In FIG. 3, the collector current of Q3 is amplified by a Darlington cascade connection of transistors Q5A and Q5B, rather than a simple common-collector transistor Q5, and R1 again connects node N2 to $+V_{CC}$. Another terminal is provided at which current is demanded in response to input current being applied to the INPUT terminal, this other terminal being marked OUTPUT' and shown connected by a separate load to the $+V_{CC}$ bus. Current demand at the OUTPUT' terminal is presented by the collector of a transistor Q6 which receives forward base current via resistor R6 from the emitter electrode Q5B whenever Q3 is conductive. Resistor R6 prevents the emitter of Q5B from being clamped to COMMON by the base-emitter junction of Q6. The direct-coupled collector-to-base feedback connection of Q1 includes, in addition to common-base amplifier transistor Q3 and transistors Q5A and Q5B in potential follower configuration, a portion R4 of a resistive potential divider comprising resistors R3 and R4. This potential divider causes the emitter potential of Q5B to be substantially equal to the emitter-to-base potential of Q1 multiplied by the factor $(R3+R4)/R3$, where R3 and R4 designate the resistances of the resistors as well as serving to identify them. The emitter potential of Q5B is applied via R6 to the emitter-base junction of Q6. Since the emitter voltage of Q5B is greater than the base voltage of Q2 by the factor $(R3+R4)/R3$, relatively large base current can be supplied to Q6 via R6. An advantage of this is that a much higher current level can flow in the load connected to the OUTPUT' terminal than in R2 without the need to make Q6 many times larger than Q1 which otherwise would be required. Configurations of this sort, but in which Q2 and its load are omitted, are also possible. The relatively large base current of Q6 is supplied from $+V_{CC}$ via the Darlington transistors Q5A and Q5B, so Q3 can be operated at relatively low current level.

The offset in potential between the collector electrode of Q4 and node N2, necessary to provide Q3 adequate collector potential, is provided in FIG. 3 by the potential divider action of R1 and R5.

Armed with the foregoing disclosure, one skilled in the art of electronic design can design other modifications of the circuitry described herein, and the following claims should accordingly be liberally construed to include such modifications within their scope. In particular, field effect transistors may be used in place of the bipolar transistors shown in FIGS. 1, 2 and 3.

I claim:

1. A current amplifier comprising:
input, common, and output terminals;
first and second transistors of a first conductivity type and a third transistor of a second conductivity type, each of said transistors having a first electrode, and having second and third electrodes at the ends of its principal conduction path, the conductivity of which is controlled responsive to the extent potential between its first and second electrodes exceeds a respective threshold value, the threshold values required for conduction of said first and second transistors being substantially alike, respective means connecting the first electrodes of said first and second transistors to the third electrode of said third transistor, the second electrodes of said first and second transistors being connected to said common terminal, the third electrode of said first transistor and the second electrode of said third transistor being connected to said input terminal, the third electrode of said second transistor being connected to said output terminal;
a resistance connecting the first electrode of said third transistor to a source of reverse bias potential;
a fourth transistor of said first conductivity type having a first electrode and having second and third electrodes at the ends of its principal conduction path, the conductivity of which is controlled responsive to the extent potential between its first and second electrodes exceeds a respective threshold value;
means for selectively applying forward bias signal between the first and second electrodes of said fourth transistor for biasing it into full conduction, and clamping its second and third electrodes close together in potential; and
potential offsetting means connected in series with the principal conduction path of said fourth transistor between the first electrode of said third transistor and said common terminal, said fourth transistor oriented in said series connection so its second and third electrodes are closer, respectively, to said common terminal and to the first electrode of said third transistor, said potential offsetting means providing sufficient potential offset to assure said third transistor adequate potential between its second and third electrodes to function in the normal transistor mode.

2. A current amplifier as recited in claim 1 further comprising a fourth transistor of said first conductivity type having a first electrode coupled via an impedance to the third electrode of said third transistor, having a second electrode connected to said common terminal and having a third electrode coupled to a further output terminal.

3. A current amplifier as set forth in claim 1 wherein the respective means connecting the first electrodes of said first and second transistors includes:
(a) a resistive potential divider having an input connection from the third electrode of said third transistor, an output connection to the first electrode of said first transistor, and a common connection to said common terminal; and
(b) a further resistance connected at a first end thereof to the third electrode of said third transistor and at a second end thereof to the first electrode of said second transistor.

4. A current amplifier comprising:
input, common, and output terminals;
first and second transistors of a first conductivity type, and a third transistor of a second conductivity type, each of said transistors having a first electrode, and having second and third electrodes at the ends of its principal conduction path, the conductivity of which is controlled responsive to the extent potential between its first and second electrodes exceeds a respective threshold value, the threshold values required for conduction of said first and second transistors being substantially alike, respective means connecting the first electrodes of said first and second transistors to the third electrode of said third transistor, the second electrodes of said first and second transistors being connected to said common terminal, the third electrode of said first transistor and the second electrode of said third transistor being connected to said input terminal, the third electrode of said second transistor being connected to said output terminal;
a resistance connecting the first electrode of said third transistor to its second electrode;
a fourth transistor of said first conductivity type having a first electrode and having second and third electrodes at the ends of its principal conduction path the conductivity of which is controlled responsive to the extent potential between its first and second electrodes exceeds a respective threshold value;
means for selectively applying forward bias signal between the first and second electrodes of said fourth transistor for biasing it into full conduction, clamping its second and third electrodes close together in potential; and
potential offsetting means connected in series with the principal conduction path of said fourth transistor between the first electrode of said third transistor and said common terminal, said fourth transistor oriented in said series connection so its second and third electrodes are closer, respectively, to said common terminal and to the first electrode of said third transistor, said potential offsetting means for providing sufficient potential offset to assure said third transistor adequate potential between its second and third electrodes to function in the normal transistor mode.

5. A current amplifier comprising:
input, common, and output terminals;
first and second transistors of a first conductivity type and a third transistor of a second conductivity type, each of said transistors having a first electrode, and having second and third electrodes at the end of its principal conduction path, the conductivity of which is controlled responsive to the extent potential between its first and second electrodes exceeds a respective threshold value, the threshold values required for conduction of said first and second transistors being substantially alike, respective means connecting the first electrodes of said first and second transistors to the third electrode of said third transistor, the second electrodes of said first and second transistors being connected to said common terminal, the third electrode of said first transistor and the second electrode of said third transistor being connected to said input terminal, the third electrode of said second transistor being connected to said output terminal;

a first resistance connecting the first electrode of said third transistor to a source of reverse bias potential;

a fourth transistor of said first conductivity type having a first electrode and having second and third electrodes at the ends of its principal conduction path, the conductivity of which is controlled responsive to the extent potential between its first and second electrodes exceeds a respective threshold value;

means for selectively applying forward bias signal between the first and second electrodes of said fourth transistor for biasing it into full conduction and clamping its second and third electrodes close together in potential; and a second resistance connected in series with the principal conduction path of said fourth transistor between the first electrode of said third transistor and said common terminal, said fourth transistor oriented in said series connection so its second and third electrodes are closer, respectively, to said common terminal and to the first electrode of said third transistor, said first and second resistances cooperating to form potential offsetting means for providing sufficient potential offset to assure said third transistor adequate potential between its second and third electrodes to function in the normal transistor mode.

* * * * *